United States Patent
Ota et al.

(10) Patent No.: US 12,477,829 B2
(45) Date of Patent: Nov. 18, 2025

(54) METHOD FOR MANUFACTURING SEMICONDUCTOR DEVICE AND SEMICONDUCTOR DEVICE

(71) Applicant: ROHM CO., LTD., Kyoto (JP)

(72) Inventors: Shingo Ota, Kyoto (JP); Jun Terada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 445 days.

(21) Appl. No.: 17/926,630

(22) PCT Filed: Aug. 6, 2021

(86) PCT No.: PCT/JP2021/029337
§ 371 (c)(1),
(2) Date: Nov. 21, 2022

(87) PCT Pub. No.: WO2022/059381
PCT Pub. Date: Mar. 24, 2022

(65) Prior Publication Data
US 2023/0207392 A1  Jun. 29, 2023

(30) Foreign Application Priority Data
Sep. 16, 2020 (JP) .................. 2020-155578

(51) Int. Cl.
*H01L 21/78* (2006.01)
*H01L 23/00* (2006.01)
(Continued)

(52) U.S. Cl.
CPC ....... *H10D 89/013* (2025.01); *H01L 23/3121* (2013.01); *H01L 24/03* (2013.01);
(Continued)

(58) Field of Classification Search
CPC .. H10D 89/013; H10D 12/481; H10D 30/668; H10D 64/112; H10D 64/117;
(Continued)

(56) References Cited

U.S. PATENT DOCUMENTS 5,972,781 A * 10/1999 Wegleiter ................ H01L 21/78
438/464
8,048,781 B2 * 11/2011 How .................... H10D 62/117
438/464
(Continued)

FOREIGN PATENT DOCUMENTS

DE  102018205028 A1  10/2018
JP  H0963993 A  3/1997
(Continued)

OTHER PUBLICATIONS

International Search Report and Written Opinion mailed on Sep. 7, 2021, received for PCT Application PCT/JP2021/029337, filed on Aug. 6, 2021, 15 pages including English Translation.
(Continued)

*Primary Examiner* — Vu A Vu
(74) *Attorney, Agent, or Firm* — XSENSUS LLP

(57) ABSTRACT

A method for manufacturing a semiconductor device includes a step of preparing a semiconductor substrate that has a first main surface on one side and a second main surface on the other side, the semiconductor substrate on which a plurality of device forming regions and an intended cutting line that demarcates the plurality of device forming regions are set, a step of forming a first electrode that covers the first main surface in each of the device forming regions, a step of forming a second electrode that covers the second main surface, a step of partially removing the second electrode along the intended cutting line such that the semiconductor substrate is exposed, and forming a removed portion that extends along the intended cutting line, and a step of (Continued)

cutting the semiconductor substrate along the removed portion.

20 Claims, 10 Drawing Sheets

(51) Int. Cl.
*H01L 23/31* (2006.01)
*H10D 89/00* (2025.01)

(52) U.S. Cl.
CPC .............. *H01L 24/29* (2013.01); *H01L 24/32* (2013.01); *H01L 24/48* (2013.01); *H01L 2224/0221* (2013.01); *H01L 2224/03019* (2013.01); *H01L 2224/039* (2013.01); *H01L 2224/29139* (2013.01); *H01L 2224/32245* (2013.01); *H01L 2224/48151* (2013.01); *H01L 2924/1011* (2013.01); *H01L 2924/10156* (2013.01); *H01L 2924/10272* (2013.01); *H01L 2924/12032* (2013.01); *H01L 2924/13055* (2013.01); *H01L 2924/13091* (2013.01)

(58) Field of Classification Search
CPC .............. H10D 62/107; H10D 62/8325; H10D 62/8603; H10D 62/393; H01L 23/3121; H01L 24/03; H01L 24/29; H01L 24/32; H01L 24/48; H01L 2224/0221; H01L 2224/03019; H01L 2224/039; H01L 2224/29139; H01L 2224/32245; H01L 2224/48151; H01L 2924/1011; H01L 2924/10156; H01L 2924/10272; H01L 2924/12032; H01L 2924/13055; H01L 2924/13091; H01L 2221/68327; H01L 21/6835; H01L 21/78

USPC .......................................................... 257/77
See application file for complete search history.

(56) References Cited

U.S. PATENT DOCUMENTS

| | | | |
|---|---|---|---|
| 8,637,967 B2* | 1/2014 | Menath | H01L 23/3114 |
| | | | 438/464 |
| 9,196,537 B2* | 11/2015 | Van Gemert | H01L 23/488 |
| 9,472,458 B2* | 10/2016 | Doub | H01L 21/02334 |
| 10,354,968 B2* | 7/2019 | Kimura | H01L 24/13 |
| 10,366,948 B2* | 7/2019 | Kasuya | H01L 21/561 |
| 10,607,889 B1* | 3/2020 | Seddon | H01L 21/6836 |
| 10,910,270 B2* | 2/2021 | Choi | H01L 21/78 |
| 10,916,474 B2* | 2/2021 | Grivna | H01L 21/30655 |
| 11,107,893 B2* | 8/2021 | Schulze | H01L 21/0485 |
| 2006/0118510 A1 | 6/2006 | Fujii | |
| 2013/0071970 A1* | 3/2013 | Fujimoto | H01L 24/97 |
| | | | 257/E21.599 |

FOREIGN PATENT DOCUMENTS

| | | |
|---|---|---|
| JP | 2014-013812 A | 1/2014 |
| JP | 2016-018846 A | 2/2016 |
| JP | 2018-181902 A | 11/2018 |
| WO | 2010/086952 A1 | 8/2010 |

OTHER PUBLICATIONS

Office Action dated Apr. 8, 2025 issued in corresponding German patent application No. 11 2021 001 903.1 (16 pages; with English translation).
Notice of Reasons for Refusal dated Sep. 11, 2025 in corresponding Japanese patent application No. 2022-550407 (11 pages; with English machine translation).

* cited by examiner

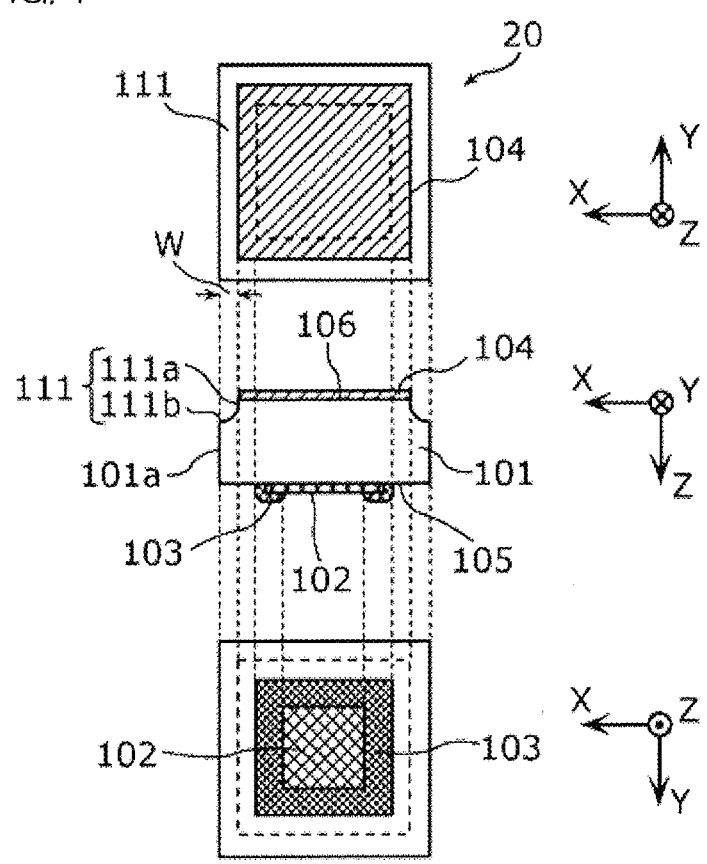

METHOD FOR MANUFACTURING SEMICONDUCTOR DEVICE AND SEMICONDUCTOR DEVICE

CROSS-REFERENCE TO RELATED APPLICATIONS

This application is based on PCT filing PCT/JP2021/029337, filed on Aug. 6, 2021, which claims priority to Japanese Patent Application No. 2020-155578, filed with the Japan Patent Office on Sep. 16, 2020, the entire disclosure of each of which is incorporated herein by reference.

TECHNICAL FIELD

The present invention relates to a method for manufacturing a semiconductor device and a semiconductor device.

BACKGROUND ART

In a method for manufacturing a semiconductor device, a step of dividing a semiconductor wafer into chip units by using a dicing blade may be performed (for example, see Patent Literature 1).

CITATION LIST

Patent Literature

Patent Literature 1: Japanese Patent Application Publication No. 2014-13812

SUMMARY OF INVENTION

Technical Problem

A preferred embodiment provides a highly reliable method for manufacturing a semiconductor device and a highly reliable semiconductor device.

Solution to Problem

A preferred embodiment of the present invention provides a semiconductor device including a step of preparing a semiconductor substrate that has a first main surface on one side and a second main surface on the other side, the semiconductor substrate on which a plurality of device forming regions and an intended cutting line that demarcates the plurality of device forming regions are set, a step of forming a first electrode that covers the first main surface in each of the device forming regions, a step of forming a second electrode that covers the second main surface, a step of partially removing the second electrode along the intended cutting line such that the semiconductor substrate is exposed, and forming a removed portion that extends along the intended cutting line, and a step of cutting the semiconductor substrate along the removed portion.

A preferred embodiment provides a semiconductor device including a semiconductor substrate that has a first main surface on one side and a second main surface on the other side, a first electrode that covers the first main surface, and a second electrode that is separated from a peripheral edge of the second main surface such that a peripheral edge portion of the second main surface is exposed, and covers the second main surface.

The aforementioned as well as yet other objects, features, and effects of the present invention will be made clear by the following description of the preferred embodiments, with reference to the accompanying drawings.

BRIEF DESCRIPTION OF DRAWINGS

FIG. 7 is a diagram showing plan and sectional structures of the semiconductor device according to the preferred embodiment.

DESCRIPTION OF EMBODIMENTS

Each of the preferred embodiments described below illustrates a comprehensive or specific example. Numerical values, shapes, materials, constituent elements, arranged positions and connection forms of the constituent elements, steps, order of the steps, etc., described with the following preferred embodiments are examples and are not intended to limit the present invention. Among the constituent elements in the following preferred embodiments, a constituent element that is not described in an independent claim is described as an optional constituent element.

The attached drawings are schematic views and are not necessarily drawn precisely. For example, the scales, etc., do not necessarily match between the attached drawings. In the attached drawings, arrangements that are substantially the same are provided with the same reference signs and redundant description is omitted or simplified.

In the present description, all of the terms that represent relationships between elements such as vertical or horizontal, terms that represent shapes of elements such as rectangular, and numerical ranges are not expressions expressing just strict meanings but are expressions meaning to include substantially equivalent ranges.

In the present description, the terms "upper/above" and "lower/below" do not indicate an upper direction (vertically upper) and a lower direction (vertically lower) in terms of absolute spatial recognition but are defined by a relative positional relationship based on an order of lamination in a laminated arrangement. For example, descriptions are provided with a first main surface side of a semiconductor layer as an upper side (above) and a second main surface side as a lower side (below). In actual use of a semiconductor device (vertical transistor), the first main surface side may be a lower side (below) and the second main surface side may be an upper side (above). As a matter of course, the semiconductor device (vertical transistor) may be used in an orientation where the first main surface and the second main surface are inclined or orthogonal with respect to a horizontal plane.

The terms "upper/above" and "lower/below" are further applied in a case where two constituent elements are arranged and separated from each other in the up and down direction such that another constituent element is interposed between the two constituent elements as well as in a case where two constituent elements are arranged in the up and down direction such that the two constituent elements are adhered closely to each other.

Figure 1:
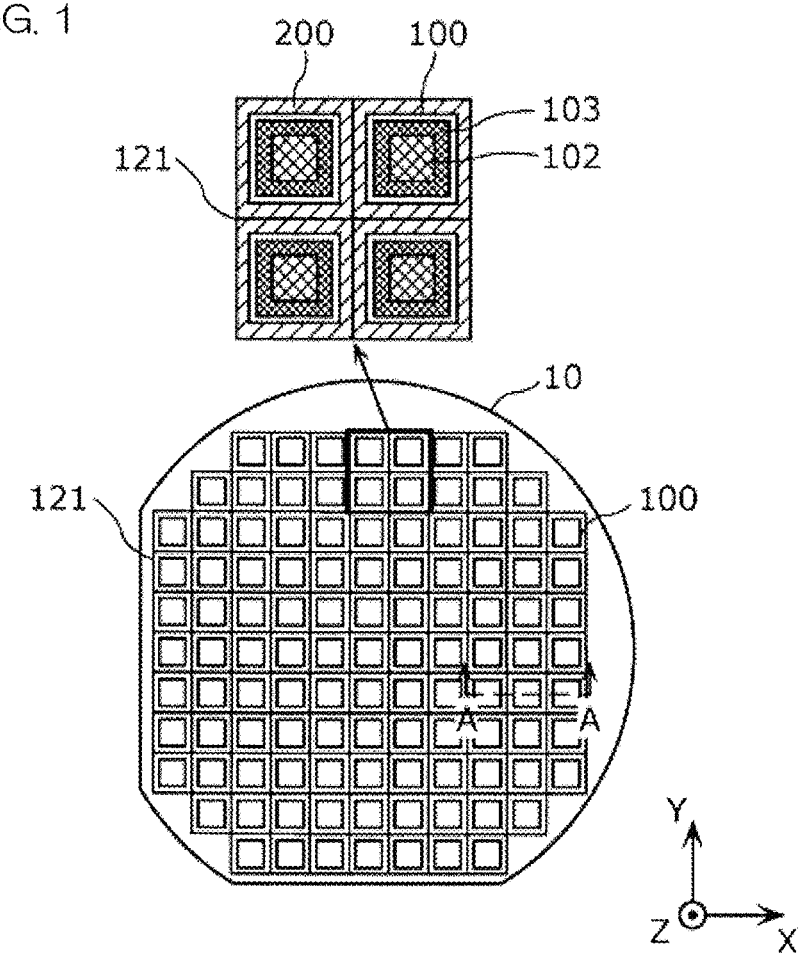
FIG. 1 is a plan view of a semiconductor wafer according to a preferred embodiment.

In this preferred embodiment, a method for cutting a semiconductor wafer by a dicing blade such that the semiconductor wafer is divided into chip units (also called semiconductor chips or semiconductor devices) will be described. First, an arrangement of the semiconductor wafer will be described. FIG. 1 is a top surface view of a semiconductor wafer 10 according to this preferred embodiment.

The semiconductor wafer 10 is, for example, an SiC (silicon carbide) semiconductor wafer that includes an SiC monocrystal. The SiC monocrystal may be an SiC monocrystal of hexagonal crystal. The SiC monocrystal may be a 4H—SiC monocrystal. A unit cell of the 4H—SiC monocrystal includes tetrahedral structures in each of which a single Si atom and four C atoms are bonded in a tetrahedral arrangement relationship. A unit cell of the SiC monocrystal includes tetrahedral structures in each of which four C atoms are bonded to a single Si atom in a tetrahedral arrangement (regular tetrahedral arrangement) relationship. The unit cell has an atomic arrangement in which the tetrahedral structures are four-period stacked.

The unit cell has a hexagonal prism structure having a regular hexagonal silicon plane, a regular hexagonal carbon plane, and six side planes connecting the silicon plane and the carbon plane. The silicon plane is an end plane terminated by Si atoms. At the silicon plane, a single Si atom is positioned at each of the six vertices of a regular hexagon and a single Si atom is positioned at a center of the regular hexagon. The carbon plane is an end plane terminated by C atoms. At the carbon plane, a single C atom is positioned at each of the six vertices of a regular hexagon and a single C atom is positioned at a center of the regular hexagon.

The silicon plane is the (0001) plane. The carbon plane is the (000-1) plane. The (0001) plane and the (000-1) plane are collectively referred to as c planes. The [0001] direction and the [000-1] direction are collectively referred to as the c axis direction. A (11-20) plane and a (-1-120) plane are collectively referred to as a planes. The [11-20] direction and the [-1-120] direction are collectively referred to as the a-axis direction. A (1-100) plane and a (-1100) plane are collectively referred to as m planes. The [1-100] direction and the [-1100] direction are collectively referred to as the m-axis direction.

The semiconductor wafer 10 includes a plurality of semiconductor device forming regions 100 (device forming regions) and dicing street regions 200 serving as an example of an intended cutting line. In each of the semiconductor device forming regions 100, a semiconductor element structure to become a semiconductor element after the semiconductor wafer is diced by dicing is formed. The semiconductor element is, for example, a vertical power semiconductor element. Specifically, the semiconductor element is a vertical diode or a vertical transistor. The vertical diode may include a vertical SBD (Schottky Barrier Diode). The vertical transistor may include a vertical MISFET (Metal Insulator Semiconductor Field Effect Transistor).

Figure 2:
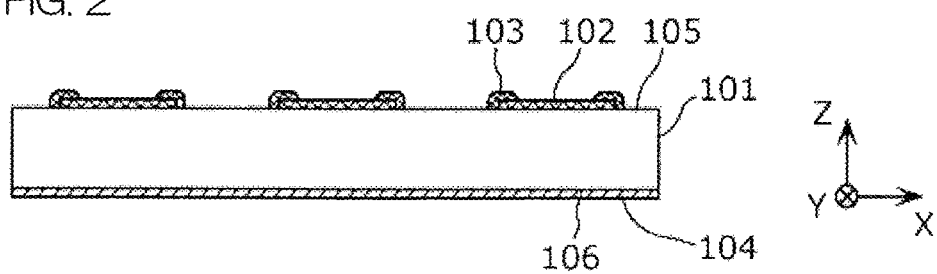
FIG. 2 is a sectional view of the semiconductor wafer according to the preferred embodiment.

FIG. 2 is a sectional view taken along A-A shown in FIG. 1. As shown in FIG. 2, the semiconductor wafer 10 includes a semiconductor substrate 101, first electrodes 102, protective films 103, and a second electrode 104.

The semiconductor substrate 101 is, for example, an SiC substrate that includes an SiC monocrystal. The semiconductor substrate 101 has a first main surface 105 and a second main surface 106 on the opposite side of the first main surface. Preferably, the first main surface 105 is the (0001) plane (silicon plane), and the second main surface 106 is the (000-1) plane (carbon plane). Such an arrangement is effective in a case where the semiconductor device includes an SiC-MOSFET or an SiC-SBD. Each of the first electrodes 102 is a metal electrode that is formed on the first main surface 105 of the semiconductor substrate 101 for each of the semiconductor device forming regions 100 (for each semiconductor element).

Each of the protective films 103 is formed to surround a periphery of the first electrode 102 in a plan view, and protects the periphery of the first electrode 102. The protective film 103 is, for example, an organic film that includes polyimide, PBO (polybenzoxazole), etc. The protective film 103 may be an inorganic film that includes silicon nitride (SiN), silicon oxide ($SiO_2$), etc. The protective film 103 may have a single layer structure or may be formed by laminating a plurality of types of materials. For example, the protective film 103 may have a laminated structure that includes an inorganic film and an organic film that are laminated in that order from the first semiconductor substrate 101 side.

The second electrode 104 is a metal electrode that is uniformly formed on the second main surface 106 of the semiconductor substrate 101. That is, the second electrode 104 is formed commonly over the plurality of semiconductor device forming regions 100 in the semiconductor wafer 10. The second electrode 104 may cover the entire region of the second main surface 106. The second electrode 104 is formed by, for example, a laminated film of titanium (Ti), nickel (Ni), palladium (Pd), and gold (Au). As a matter of course, the second electrode 104 may be formed of other materials such as aluminum, copper, silver, titanium nitride, or tungsten.

The second electrode 104 preferably has a single layer structure or a laminated structure that includes at least one layer among a Ti layer, an Ni layer, an Ni alloy layer, and an Au layer. The second electrode 104 particularly preferably has a single layer structure or a laminated structure that includes one layer among or both an Ni layer and an Ni alloy layer. For example, the second electrode 104 may have a laminated structure that includes a Ti layer, an Ni layer, and an Au layer that are laminated in that order from the second main surface 106 side.

The second electrode 104 may have a laminated structure that includes an NiSi layer, a Ti layer, and an Ni layer that are laminated in that order from the second main surface 106 side. The second electrode 104 may have a laminated structure that includes an Ni layer, a Ti layer, and an Ni layer that are laminated in that order from the second main surface 106 side. The second electrode 104 may have a laminated structure that includes an Ni layer, a Ti layer, and an NiV layer that are laminated in that order from the second main surface 106 side. The second electrode 104 may have a laminated structure that includes an Ni layer and an Au layer that are laminated in that order from the second main surface 106 side.

For example, the thickness of the second electrode 104 may be not less than 500 nm. The thickness of the second electrode 104 may be not more than 1,500 nm. The second electrode 104 may be arranged such that the total layer thickness of an Ni layer or an Ni alloy layer is not less than 500 nm in the laminated structure. The second electrode 104 may be arranged such that only an Ni layer is not less than 500 nm in the laminated structure. In a case where the second electrode 104 includes a Ti layer, the second electrode 104 may be arranged such that the Ti layer is not less than 500 nm and not more than 100 nm.

An example of the semiconductor element that has two electrodes (such as a diode) is described here. However, a semiconductor element that has three or more electrodes (such as a transistor) may be adopted. In a case where the semiconductor element has three or more electrodes, one of the semiconductor elements in the semiconductor wafer 10 has two or more first electrodes 102 that are formed on the first main surface 105.

The known arrangements and the known methods for manufacturing are adopted as the arrangement of the semiconductor wafer 10, the arrangement of the semiconductor element, and the methods for manufacturing the semiconductor wafer 10 and the semiconductor element. First, the semiconductor substrate 101 that is made of SiC is prepared. The semiconductor substrate 101 may have such an arrangement that, by an epitaxial growth method, on a semiconductor substrate that has a relatively high impurity concentration, a semiconductor layer that has a lower impurity concentration than the semiconductor substrate is formed.

Next, an internal structure corresponding to functions of the semiconductor element is formed in a surface layer portion of the semiconductor substrate 101. Next, the plurality of first electrodes 102 are formed on the first main surface 105 of the semiconductor substrate 101. Next, each of the protective films 103 is formed in the periphery of each of the first electrodes 102 on the first main surface 105. Next, the second electrode 104 is formed on the second main surface 106 of the semiconductor substrate 101. The second electrode 104 is formed over the entire region of the second main surface 106 (entire surface of the semiconductor wafer 10).

The entire region of the second main surface 106 (entire surface of the semiconductor wafer 10) is not necessarily all the second main surface 106 including a case where no second electrode 104 is formed in part of the region such as a peripheral portion of the semiconductor wafer 10. The semiconductor substrate 101 may be adjusted to have predetermined thickness by a grinding method before a step of forming the second electrode 104.

As a matter of course, in a case where an Si-based device is applied, a semiconductor substrate 101 that is made of silicon may be prepared in place of SiC. In a case where the semiconductor element is an IGBT, a rear surface structure such as a collector layer is formed in a surface layer portion of the second main surface 106 before the step of forming the second electrode 104. A detailed arrangement example of the semiconductor element will be described later using FIG. 15, FIG. 16, and FIG. 17.

The semiconductor wafer 10 is cut along dicing streets 121 serving as an example of an intended cutting line shown in FIG. 1 by a dicing blade and divided into a plurality of semiconductor devices (semiconductor chips). The dicing streets are set to demarcate regions to be diced as semiconductor devices 20 in the semiconductor substrate 101. Specifically, the dicing streets are set respectively in the X direction and the Y direction shown in FIG. 1, etc. and a blade dicing method is performed respectively in the X direction and the Y direction.

The dicing direction may be the positive direction or the negative direction of the X axis and the Y axis. The X direction and the Y direction shown in FIG. 1, etc., are, for example, the 11-20 direction (a-axis direction) of an SiC monocrystal and the 1-100 direction (m-axis direction). That is, the dicing streets 121 extend along the 11-20 direction and the 1-100 direction.

Next, a method for dividing the semiconductor wafer 10 into the plurality of semiconductor devices (semiconductor chips) will be described. FIG. 3 to FIG. 6 are diagrams for describing a step of dividing the semiconductor wafer 10.

Figure 3:
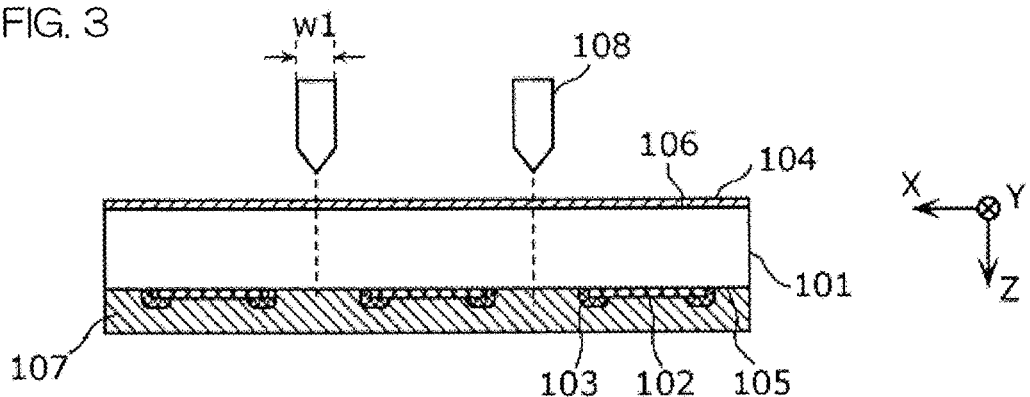
FIG. 3 is a sectional view showing a manufacturing step of a semiconductor device according to the preferred embodiment.

First, as shown in FIG. 3, the semiconductor wafer 10 that includes the semiconductor substrate 101, the first electrode 102, the protective film 103, and the second electrode 104 is held (supported) by a holding member 107 (supporting member). The semiconductor substrate 101 is held from the first main surface 105 side by the holding member 107 in an orientation that the second main surface 106 side is directed upward. That is, the semiconductor wafer 10 is held by the holding member 107 in an orientation reversed upside down from the orientation shown in FIG. 2.

Figure 4:
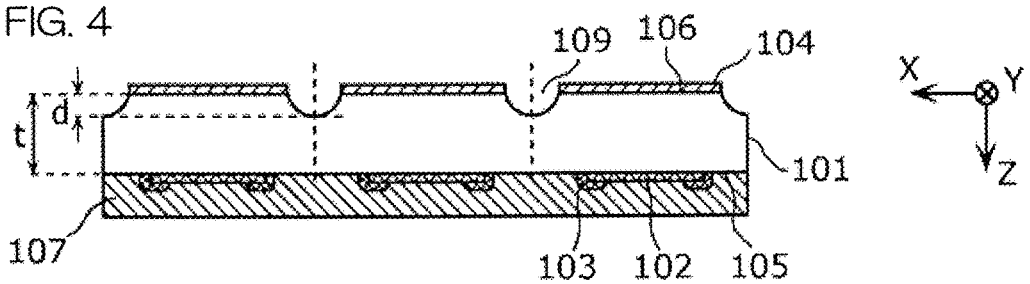
FIG. 4 is a sectional view showing the manufacturing step of the semiconductor device according to the preferred embodiment.

Next, as shown in FIG. 3 and FIG. 4, a partial cutting step by the blade dicing method using a first blade 108 is performed. In the partial cutting step, the second electrode 104 is partially removed along the dicing streets 121 such that the semiconductor substrate 101 is exposed. In the partial cutting step, specifically, part of the second electrode 104 and part of the semiconductor substrate 101 are removed along the dicing streets to pass through the second electrode 104 from the second main surface 106 side and reach a thickness direction intermediate portion of the semiconductor substrate 101.

In the partial cutting step, by removing part of the second electrode 104 along the dicing streets from the second main surface 106 side such that part of the semiconductor substrate 101 remains, a removed region 109 (groove) is formed. At least part or all of the removed region 109 is preferably positioned on the outside of an outer end edge of the protective film 103 so as not to overlap the protective film 103 in a plan view.

By the partial cutting step, the portions of the second electrode 104 positioned on the dicing streets are removed, and part of the semiconductor substrate 101 is also removed. The depth of the removed region 109 shown in FIG. 4 is just an example, and the present invention is not limited to this. For example, the depth d of the removed region 109 in the semiconductor substrate 101 may be not more than 70% of the thickness t of the semiconductor substrate 101. In a case where the semiconductor substrate 101 has an epitaxial layer, the depth d is preferably depth with which the removed region does not reach the epitaxial layer.

For example, the semiconductor substrate 101 may include a substrate (SiC substrate) and an epitaxial layer (SiC epitaxial layer) that are laminated in that order from the second main surface 106 side toward the first main surface 105 side. In this case, the removed region 109 is preferably formed on the second main surface 106 in the substrate. The removed region 109 is further preferably formed in the substrate at an interval from the epitaxial layer to the second main surface 106 side. The removed region 109 preferably surrounds an inner portion of the epitaxial layer in each of the semiconductor device forming regions 100 (that is, an internal structure of the semiconductor element) in a plan view.

The thickness t of the semiconductor substrate 101 may be, for example, not more than 350 μm, not more than 200 μm, not more than 150 μm, or not more than 100 μm. The depth d preferably has a depth that is sufficient for reliably removing the second electrode 104. For example, the depth d is preferably not less than 5 μm. For example, in a case where the thickness of the second electrode 104 is not less than 500 nm and not more than 1,500 nm, a distance from a surface of the second electrode 104 to a bottom portion of the groove (that is, the total thickness and the depth d of the second electrode 104) may be not less than 10 μm. As a matter of course, only the second electrode 104 may be removed such that the semiconductor substrate 101 is not removed.

Figure 5:
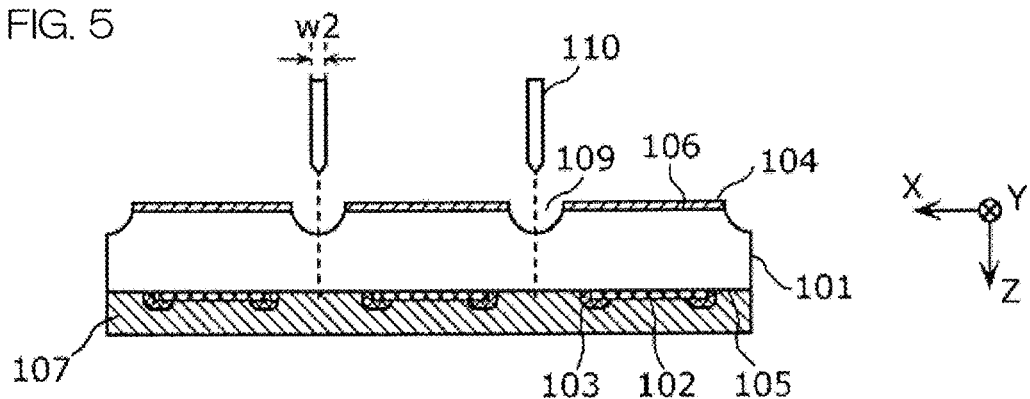
FIG. 5 is a sectional view showing the manufacturing step of the semiconductor device according to the preferred embodiment.
Figure 6:
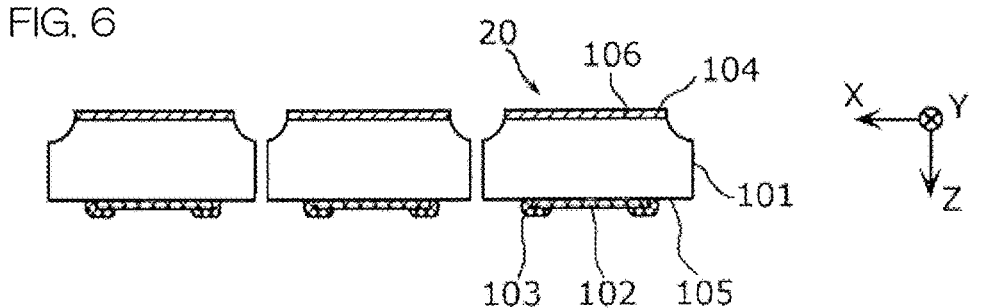
FIG. 6 is a sectional view showing the manufacturing step of the semiconductor device according to the preferred embodiment.

Next, as shown in FIG. 5 and FIG. 6, in the removed region 109, a full cutting step using a second blade 110 by the blade dicing method is performed, and the semiconductor substrate 101 is diced into the plurality of semiconductor devices 20. Specifically, by the blade dicing method, the second blade 110 is abutted with the removed region 109, and the semiconductor substrate 101 is cut from the second main surface 106 side such that the second blade 110 passes through the semiconductor substrate 101. Thereby, the plurality of semiconductor devices 20 are manufactured. Thereafter, as shown in FIG. 6, the holding member 107 is removed from the semiconductor substrate 101, and the plurality of semiconductor devices 20 are acquired.

In this preferred embodiment, the dicing steps are thus performed from the second main surface 106 side. Thereby, particularly in a case where the semiconductor substrate 101 is an SiC substrate, in comparison to a case where dicing is performed from the first main surface 105 side, a cut surface can be smoothed and the occurrence of chipping can be suppressed.

In a case where dicing is performed from the second main surface 106 side, burrs may occur on the second main surface 106 side of the cut surface. In particular, in a case where a dicing blade that has a small abrasive grain diameter is used, an occurrence rate of burrs is increased. This burr is a residue of the second electrode 104 that is made of ductile metal, and there is sometimes a case where the burr is as long as some hundreds of μm. In a case where this burr reaches the first main surface 105 from the second main surface 106, there occurs a problem that a short circuit is formed between the second electrode 104 and the first electrode 102. The smaller the thickness of the semiconductor substrate 101 becomes, the more remarkable this problem becomes.

In this preferred embodiment, the two cutting steps of the partial cutting step and the full cutting step are performed. Thus, occurrence of such a problem is suppressed. Specifically, metal on the dicing streets is removed in advance by the partial cutting step, and the full cutting step is performed on the portions from which the metal is removed. Thus, the occurrence of burrs that reach the first main surface 105 from the second main surface 106 can be suppressed. Therefore, a method for manufacturing according to this preferred embodiment can realize improvement of a yield ratio of the semiconductor devices 20. That is, the highly reliable method for manufacturing the semiconductor devices 20 with which the occurrence of burrs is suppressed can be provided. In addition, the highly reliable semiconductor devices in which the occurrence of burrs is suppressed can be manufactured and provided.

As shown in FIG. 3 and FIG. 5, first thickness w1 of the first blade 108 that is used in the partial cutting step is thicker than second thickness w2 of the second blade 110 that is used in the full cutting step. That is, the second thickness w2 is less than the first thickness w1 (w2<w1). Thereby, a cut surface in the full cutting step is positioned at a different point from a cut surface in the partial cutting step (that is, a X-direction position of the cut surface in FIG. 6, etc., is different). Thereby, in comparison to a case where the thickness is the same between the blades, the full cutting step can be reliably performed on the portions from which the metal is removed.

Therefore, the occurrence of burrs that reach the first main surface 105 from the second main surface 106 can be further suppressed. This effect is particularly effective in a case where the effect is applied to a vertical power semiconductor element that has a withstand voltage of not less than 650 V and also has a substrate thickness of not more than 150 μm. The vertical power semiconductor element that has the withstand voltage of not less than 650 V includes an SiC-MOSFET, an SiC-SBD, and an Si-IGBT.

The first thickness w1 and the second thickness w2 may be equal to each other. In this case, an abrasive grain diameter of the first blade 108 may be larger than an abrasive grain diameter of the second blade 110. That is, the first blade 108 may be rougher than the second blade 110. Thereby, the same effect as the case where the first thickness w1 is larger than the second thickness w2 can be realized.

The first thickness w1 may be larger than the second thickness w2 and at the same time, the abrasive grain diameter of the first blade 108 may be larger than the abrasive grain diameter of the second blade 110. The more the abrasive grain diameter is increased, the more the cutting speed can be improved and the more the occurrence of burrs can be suppressed. Even in a case where burrs occur, the length of the burrs can be shortened. The more the thickness of the blade is increased, the more deterioration of the blade can be suppressed. On the other hand, the more the abrasive grain diameter is decreased, the smoother the cut surface can be realized.

As a preferred example, the blade thickness in the partial cutting step (half-cutting step) is larger than the blade thickness in the full cutting step. As a preferred example, the abrasive grain diameter in the partial cutting step (half-cutting step) is larger than the abrasive grain diameter in the full cutting step. That is, the surface roughness of the removed region 109 due to a grinding mark is preferably larger than the surface roughness of the semiconductor substrate 101 due to a grinding mark. Thereby, smoothing of the cut surface can be realized while suppressing the occurrence of burrs.

As a matter of course, in the partial cutting step and the full cutting step, the same kind of blade may be used. Even in this case, as described above, the primary dicing step and the secondary dicing step are separately performed. Thus, a possibility that continuous burrs occur can be lowered. Thereby, the occurrence of burrs that reach the first main surface 105 from the second main surface 106 can be suppressed. In this preferred embodiment, in both the steps at the time of the partial cutting step and the time of the full cutting steps, there is no need for using an ultrasonic blade. In this case, the dicing steps can be performed with a simple arrangement without an ultrasonic vibration mechanism.

In a case where the second electrode 104 includes a large amount of a relatively highly ductile metal material (such as nickel), and/or the total thickness of the second electrode 104 is thick (for example, not less than 500 nm), the occurrence rate of burrs is increased. Thus, the dicing method according to the present invention is more effective.

As a specific example, the second electrode 104 may have a laminated structure that includes a Ti layer, an Ni layer, and an Au layer that are laminated in that order from the SiC substrate side. As a specific example, the second electrode 104 may have a laminated structure that includes an NiSi layer, a Ti layer, and an Ni layer that are laminated in that order from the SiC substrate side. As a specific example, the second electrode 104 may have a laminated structure that includes an Ni layer, a Ti layer, and an Ni layer that are laminated in that order from the SiC substrate side. As a specific example, the second electrode 104 may have a laminated structure that includes an Ni layer, a Ti layer, and an NiV layer that are laminated in that order from the SiC substrate side.

In these laminated structures, the second electrode 104 may have an arrangement that the total layer thickness of Ni or nickel alloy is not less than 500 nm. The second electrode 104 may have an arrangement that only an Ni layer is not less than 500 nm. The second electrode 104 may have an arrangement that a Ti Layer is not less than 50 nm and not more than 100 nm.

Next, an arrangement of the semiconductor device 20 that is manufactured by the method for manufacturing described above will be described. FIG. 7 is a diagram showing the arrangement of the semiconductor device 20 according to this preferred embodiment. This semiconductor device 20 includes the semiconductor substrate 101, the first electrode 102, the protective film 103, and the second electrode 104.

The semiconductor substrate 101 has the first main surface 105, the second main surface 106 on the opposite side of the first main surface 105, and a plurality of side surfaces 101a that connect the first main surface 105 and the second main surface 106. For example, the semiconductor substrate 101 is an SiC substrate. A peripheral edge of the first main surface 105 is preferably angular. The plurality of side surfaces 101a are preferably constituted of ground surfaces that have grinding marks. The first electrode 102 is provided on the first main surface 105 of the semiconductor substrate 101. The protective film 103 is formed to surround the periphery of the first electrode 102.

In this preferred embodiment, the protective film 103 covers a peripheral edge portion of the first electrode 102. Specifically, the protective film 103 is formed in an annular shape that extends along the peripheral edge portion of the first electrode 102 such that an inner portion of the first electrode 102 is exposed. The protective film 103 is preferably formed at an interval inward from the peripheral edge of the first main surface 105 (plurality of side surfaces 101a) in a plan view.

The second electrode 104 is provided on the second main surface 106 of the semiconductor substrate 101. The second electrode 104 is removed together with part of the semiconductor substrate 101 in an outer peripheral region (peripheral edge portion) of the semiconductor substrate 101. In other words, the second electrode 104 is formed at an interval inward from each of the side surfaces 101a of the semiconductor substrate 101 such that an outer peripheral region (peripheral edge portion) of the second main surface 106 is exposed. The outer peripheral region is a region that has predetermined width W in a plan view. The width W of the outer peripheral region is width in the direction orthogonal to the direction in which the outer peripheral region extends in a plan view.

In a plan view, the outer peripheral region is formed in an annular shape that has an outside end edge that respectively matches the side surfaces 101a of the semiconductor substrate 101, and extends along four sides of the semiconductor substrate 101. That is, the outer peripheral region surrounds the second electrode 104 in a plan view. The outer peripheral region may surround the first electrode 102 in a plan view. The outer peripheral region may surround the protective film 103 in a plan view.

The semiconductor substrate 101 has a notched portion 111 that is formed in the outer peripheral region of the semiconductor substrate 101. The notched portion 111 is preferably constituted of a ground surface that has a grinding mark. The notched portion 111 may have surface roughness that is different from surface roughness of the plurality of side surfaces 101a. In this case, the surface roughness of the notched portion 111 is preferably larger than the surface roughness of the plurality of side surfaces 101a.

The notched portion 111 is recessed from the peripheral edge portion of the second main surface 106 toward a peripheral edge portion of the first main surface 105. The notched portion 111 is formed to continue to a peripheral edge of the second electrode 104. That is, the notched portion 111 has a wall surface that is demarcated by the second electrode 104 and the semiconductor substrate 101.

The second electrode 104 has an outer peripheral end (peripheral end portion) that is formed to cover a central portion of the second main surface 106 in a plan view, and to be separated respectively from the side surfaces 101a of the semiconductor substrate 101 by the predetermined width W. In this preferred embodiment, the second electrode 104 is formed in a rectangular shape that is demarcated by the outer peripheral region (notched portion 111) in a plan view.

That is, the notched portion 111 (outer peripheral region) surrounds the second electrode 104 in a plan view. The notched portion 111 may surround the first electrode 102 in a plan view. The notched portion 111 may surround the protective film 103 in a plan view. The notched portion 111 is preferably formed such that at least part or all of the notched portion 111 does not overlap the protective film 103 in a plan view.

In a region on the outside of the outer peripheral end of the second electrode 104 (that is, the outer peripheral region), the second electrode 104 is not formed. In other words, the outer peripheral end of the second electrode 104 is separated respectively from the plurality of side surfaces 101*a* of the semiconductor substrate 101 in a plan view. In other words, in an outer peripheral end portion of the second main surface 106 of the semiconductor substrate 101, the notched portion 111 is provided to continue over the entire circumference. The width W of the outer peripheral region may be the same or may be different between the four sides of the semiconductor substrate 101.

A shape of an inner surface (wall surface) of the notched portion 111 is defined by a shape of the blade in the partial cutting step. The preferred embodiment described above shows an example in which the inner surface (wall surface) of the notched portion 111 is a recessed portion that is constituted of a curved surface. However, the dimension and the shape of the blade of the partial cutting step can be arbitrarily selected.

Figure 8A:
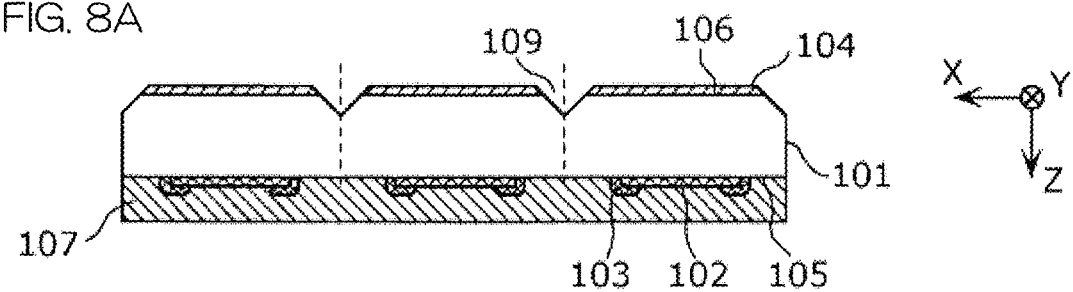
FIG. 8A is a sectional view of another example of the semiconductor wafer according to the preferred embodiment.
Figure 8B:
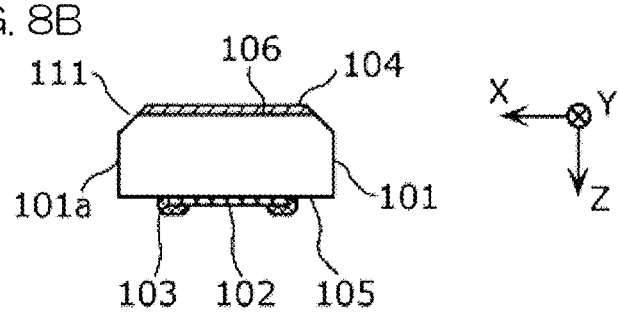
FIG. 8B is a sectional view of another example of the semiconductor device according to the preferred embodiment.

Corresponding to FIG. 4, FIG. 8A is a sectional view of a wafer of a case where bevel cut is used. FIG. 8B is a sectional view of the semiconductor device of this case. As shown in FIG. 8A, a side surface of the removed region 109 may be an oblique plane. In other words, the removed region 109 may have a wall surface that is inclined obliquely downward with respect to the second main surface 106. That is, as shown in FIG. 8B, the notched portion 111 may be an oblique plane that connects the second main surface 106 of the semiconductor substrate 101 and the side surfaces 101*a* of the semiconductor substrate 101 (that is, an oblique plane that is inclined obliquely downward from the second main surface 106 toward the side surfaces 101*a*).

Figure 9A:
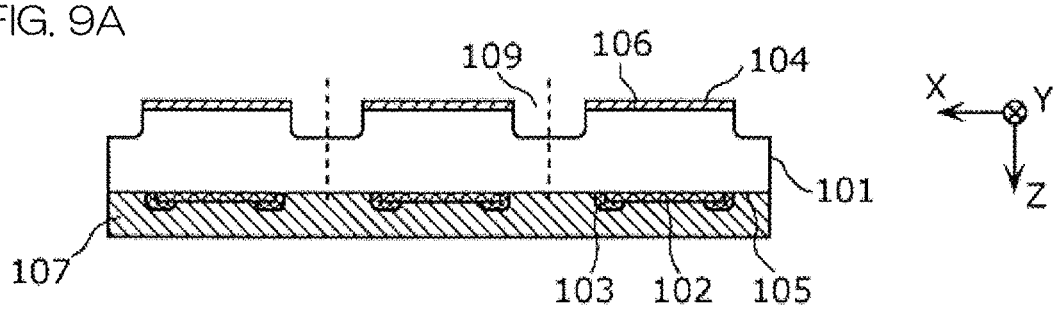
FIG. 9A is a sectional view of yet another example of the semiconductor wafer according to the preferred embodiment.
Figure 9B:
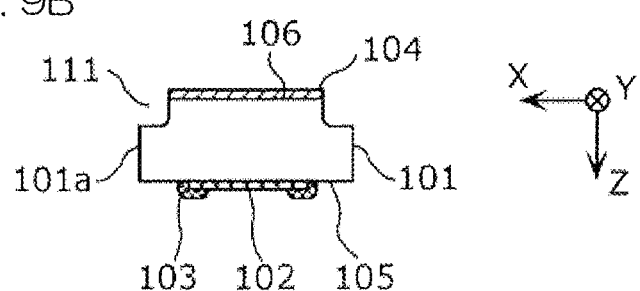
FIG. 9B is a sectional view of yet another example of the semiconductor device according to the preferred embodiment.

Corresponding to FIG. 4, FIG. 9A is a sectional view of a wafer of a case where step cut is used. FIG. 9B is a sectional view of the semiconductor device of this case. As shown in FIG. 9B, the notched portion 111 may be a step that has a side surface and a bottom surface. The side surface of the notched portion 111 may be formed substantially vertically to the second main surface 106. The bottom surface of the notched portion 111 may be formed substantially parallel to the second main surface 106.

In this preferred embodiment, the notched portion 111 is thus a concept that includes the step that is formed in the outer peripheral region (for example, FIG. 9B), the recessed portion (for example, FIG. 7, FIG. 8B, and FIG. 9B), or the oblique plane (for example, FIG. 8B). In other words, the notched portion 111 has a sectional shape of an arc, a straight line (specifically, a straight line that extends in the direction crossing the second main surface 106), or an L shape. The notched portion 111 may have a sectional shape that is arranged by one or more straight lines and one or more arcs.

The notched portion 111 is formed to surround the entire periphery of the second electrode 104 in a plan view. That is, the notched portion 111 is formed over the entire surface of the periphery of the semiconductor substrate 101 on the second main surface 106 side (entire region of the peripheral edge portion). The outer peripheral region and the notched portion 111 correspond to the removed region 109 in a manufacturing step. That is, the notched portion 111 is formed by a remaining portion of the removed region 109.

The notched portion 111 constitutes a groove shape that is continuous to an end surface of the second electrode 104. In other words, a surface of the notched portion 111 is formed continuously to the end surface of the second electrode 104. The notched portion 111 has a vertical surface portion 111*a* that is vertical to the second main surface 106 of the semiconductor substrate 101, and a coupling portion 111*b* that is connected to the side surfaces 101*a* of the semiconductor substrate 101 from the vertical surface portion 111*a*.

In other words, the notched portion 111 has a first wall portion that extends in the thickness direction of the semiconductor substrate 101, and a second wall portion that extends in the direction orthogonal to the thickness direction (see FIG. 7 to FIG. 9B). The second wall portion is a portion that extends along the first main surface 105 such as to oppose the first main surface 105 in a plan view. The second wall portion communicates with the side surfaces 101*a* of the semiconductor substrate 101 at a position that is separated from the second main surface 106 side to the first main surface 105 side. At least part or all of the notched portion 111 (outer peripheral region) is formed at a point that does not overlap the protective film 103 in a plan view.

Figure 10:
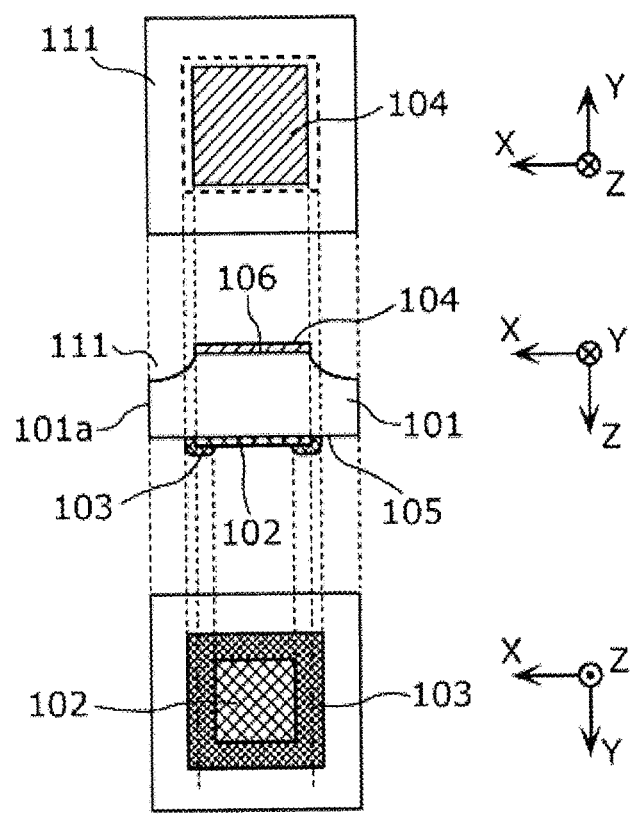
FIG. 10 is a diagram showing plan and sectional structures of still another example of the semiconductor device according to the preferred embodiment.

As a matter of course, as shown in FIG. 10, the notched portion 111 (outer peripheral region) may be formed up to a region that overlaps the protective film 103 in a plan view. That is, a portion of the notched portion 111 (outer peripheral region) that is positioned on the inner side of the second main surface 106 may overlap the protective film 103 in a plan view. Therefore, at least part of the notched portion 111 (outer peripheral region) (an end portion of the semiconductor substrate 101 on the side surfaces 101*a* side) may be formed at a point that does not overlap the protective film 103 in a plan view. Thereby, the influence of burrs can be further reduced.

Conditions of the depth dimension of the notched portion 111 and thickness dimension of the semiconductor substrate 101 shown in FIG. 7 are the same as conditions of the depth d of the removed region 109 and the thickness t of the semiconductor substrate 101 shown in FIG. 4. That is, the depth d of the notched portion 111 is not more than 70% of the thickness t of the semiconductor substrate 101. In a case where the semiconductor substrate 101 has an epitaxial layer, the depth d is preferably depth that does not reach the epitaxial layer. That is, the notched portion 111 is preferably formed at an interval from the epitaxial layer to the second main surface 106 side.

The thickness t of the semiconductor substrate 101 may be, for example, not more than 350 μm, not more than 200 μm, not more than 150 μm, or not more than 100 μm. The depth d is preferably not less than 5 μm. In a case where the thickness of the second electrode 104 is not less than 500 nm and not more than 1,500 nm, for example, a distance from the surface of the second electrode 104 to a bottom portion of the notched portion 111 (that is, the total thickness of the second electrode 104 and the depth d) may be not less than 10 μm. The width W of the notched portion 111 may be smaller than the depth d. As a matter of course, the width W may be the same as the depth d or may be larger than the depth d.

Figure 11:
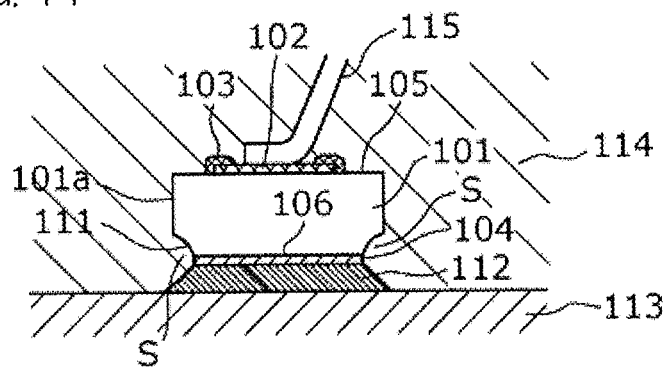
FIG. 11 is a sectional view showing an installment structure according to the preferred embodiment.
Figure 12:
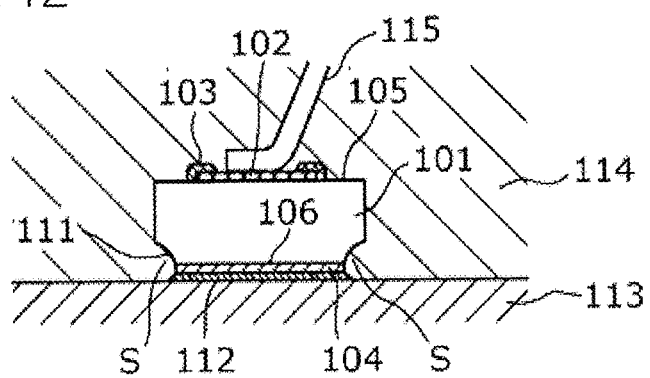
FIG. 12 is a sectional view showing another example of the installment structure according to the preferred embodiment.

FIG. 11 is a sectional view showing an installment structure (sealing structure) according to the preferred embodiment. This installment structure includes the semiconductor device 20 described above, and a base material 113 that is constituted of a conductive member. The base material 113 is made of, for example, metal such as a copper frame. The second electrode 104 of the semiconductor device 20 is bonded to the base material 113 through a bonding layer 112 that is made of a conductive material. FIG. 11 shows an example in which a solder is used as the conductive material of the bonding layer 112. FIG. 12 shows an example in which a sintered metal layer such as an Ag sintered layer (silver sintered metal layer) is used as the conductive material of the bonding layer 112.

As shown in FIG. 11 and FIG. 12, the notched portion 111 is formed in an outer peripheral end of the second main surface 106 of the semiconductor device 20. Thus, a space S (clearance) due to the notched portion 111 is formed between the semiconductor substrate 101 and the bonding layer 112. The first electrode 102 is electrically connected to a base material (not shown) that is different from the base material 113 by a conductive member 115 such as a bonding wire. The different base material is made of metal such as a copper frame that is electrically separated from the base material 113. The conductive member 115 that connects the first electrode 102 and the different base material is not limited to the bonding wire but may be a solder or a sintered metal layer.

In the examples shown in FIG. 11 and FIG. 12, the semiconductor device 20, the bonding layer 112, and the conductive member 115 are sealed by a resin 114 serving as a sealing member. In this case, the resin 114 is filled into the space S that is formed by the notched portion 111. The structure is made such that the resin 114 is fitted with (engaged with) the notched portion 111. Thus, peeling of the resin 114 from the base material 113 or the bonding layer 112 can be suppressed. Thereby, a highly reliable power semiconductor device can be provided.

The installment structure may include a plurality of fillers (filling agents) in the resin 114. In this case, the width w and the depth d of the notched portion 111 are preferably larger than an average grain diameter of the fillers. Thereby, the resin 114 can be reliably filled into the space S.

Figure 13:
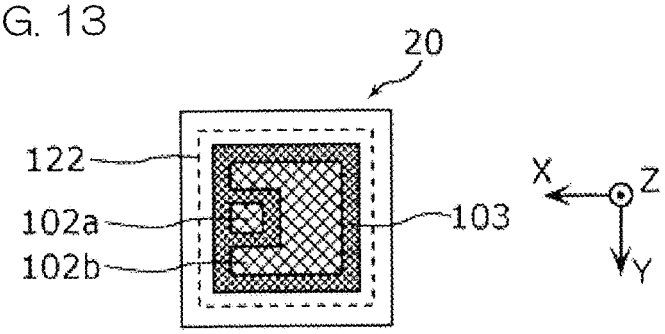
FIG. 13 is a plan view of a modified example of the semiconductor device according to the preferred embodiment.

FIG. 13 is a plan view of a semiconductor device 20 in a case where a semiconductor element is a transistor (MOSFET). As shown in FIG. 13, the semiconductor device 20 includes two first electrodes 102a, 102b, and a single second electrode 104. For example, the first electrode 102a is a gate electrode, and the first electrode 102b is a source electrode. In this case, the second electrode 104 is a drain electrode.

A broken line 122 shown in FIG. 13 shows the position of an end portion of the notched portion 111 that is formed on the second main surface 106 side (position that corresponds to the vertical surface portion 111a of FIG. 7). For example, a plan view on the second main surface 106 side is the same as the example shown in FIG. 7, and even in a case where the semiconductor element is a transistor, the notched portion 111 is formed in the outer peripheral region as in the example shown in FIG. 7.

Figure 14:
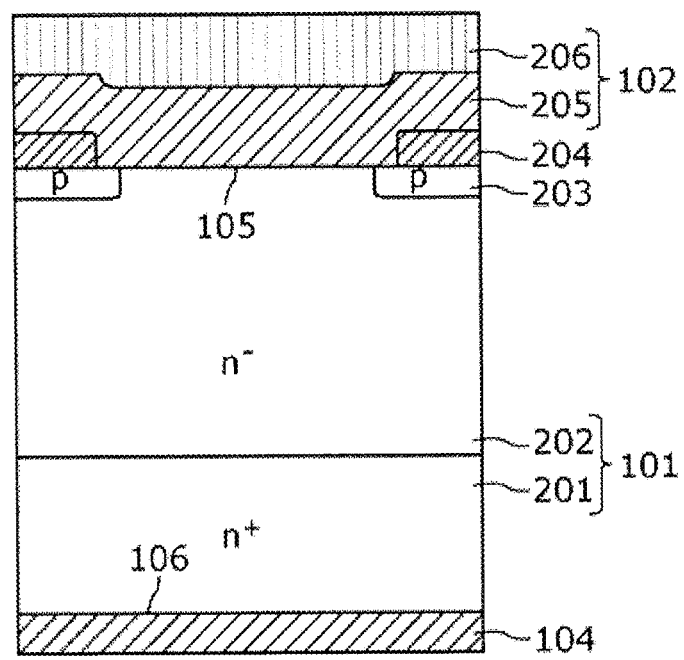
FIG. 14 is a sectional view of a diode according to the preferred embodiment.

Next, a detailed arrangement of the semiconductor element will be described. FIG. 14 is a sectional view of a semiconductor device 20 that includes a diode (SiC-SBD). In FIG. 14, the protective film 103 is not shown. This semiconductor device 20 includes a semiconductor substrate 101, a first electrode 102, and a second electrode 104. The semiconductor substrate 101 is constituted of an n+ type SiC semiconductor substrate 201 and an n− type SiC epitaxial layer 202. An impurity density of the semiconductor substrate 101 may range, for example, from about $1\times10^{18}$ cm$^{-3}$ to about $1\times10^{21}$ cm$^{-3}$. An impurity density of the SiC epitaxial layer 202 may range, for example, from about $5\times10^{14}$ cm$^{-3}$ to $5\times10^{16}$ cm$^{-3}$.

The SiC epitaxial layer 202 may include a buffer layer that is arranged on the SiC semiconductor substrate 201, and a drift layer that is arranged on the buffer layer. The semiconductor device 20 includes the second electrode 104 serving as a cathode electrode that is formed such as to cover the entire region of the second main surface 106 ((000-1) C plane) of the semiconductor substrate 101.

The semiconductor device 20 includes a field insulating film 204 that is formed on the first main surface 105 ((0001) Si plane) of the semiconductor substrate 101. The field insulating film 204 may be made of SiO$_2$ (silicon oxide). As a matter of course, the field insulating film 204 may be made of other insulating objects such as silicon nitride (SiN). The semiconductor device 20 includes the first electrode 102 serving as an anode electrode that is formed on the field insulating film 204. The first electrode 102 is connected to an anode terminal.

The first electrode 102 has a laminated structure that includes a first electrode layer 205 and a second electrode layer 206 that are laminated in that order from the SiC epitaxial layer 202 side. The first electrode layer 205 is formed on the SiC epitaxial layer 202 and the field insulating film 204. For example, the first electrode layer 205 may include at least one substance among aluminum, copper, aluminum alloy, or copper alloy. The first electrode layer 205 may include at least one substance among aluminum-silicon alloy, aluminum-silicon-copper alloy, or aluminum-copper alloy.

The second electrode layer 206 is formed on the first electrode layer 205. The second electrode layer 206 may have a single layer structure that includes a nickel layer or a copper layer. The second electrode layer 206 may have a laminated structure that includes a nickel layer and a copper layer. The second electrode layer 206 is harder than the first electrode layer 205.

The semiconductor device 20 includes a p type JTE (Junction Termination Extension) structure 203 that is formed in contact with the first electrode layer 205 of the first electrode 102 in the vicinity of a surface (surface layer portion) of the SiC epitaxial layer 202.

Figure 15:
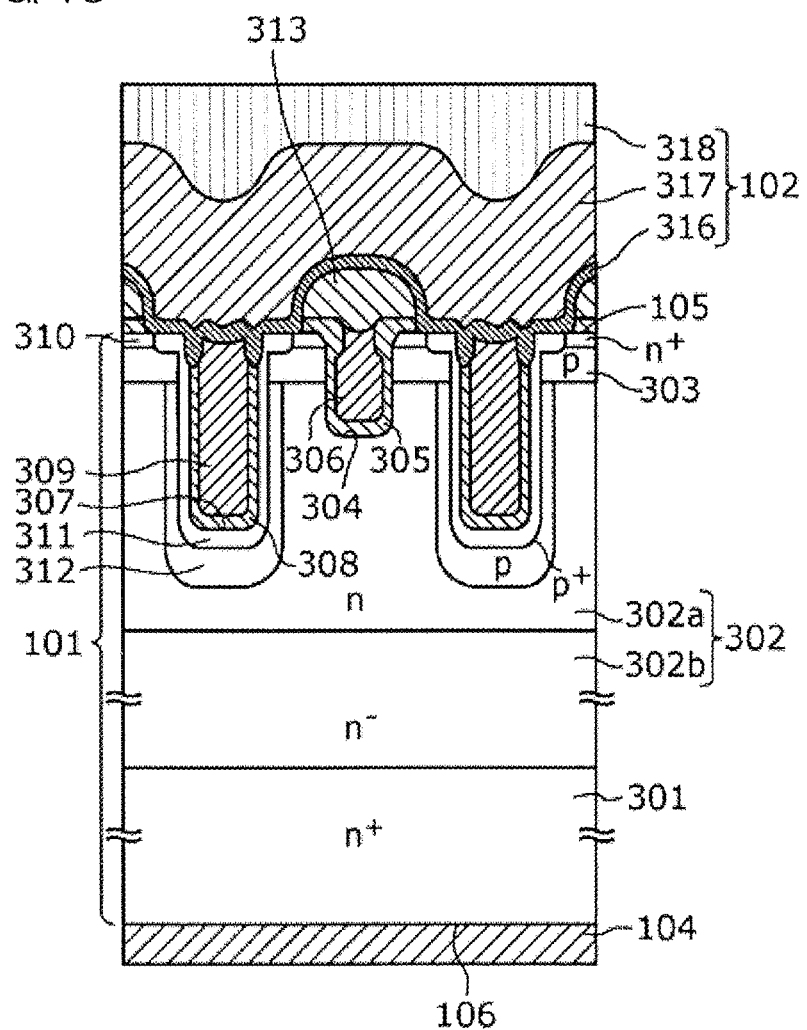
FIG. 15 is a sectional view of a transistor according to the preferred embodiment.

FIG. 15 is a sectional view of a semiconductor device 20 that includes a transistor (SiC-MOSFET). In FIG. 15, the protective film 103 is not shown. This semiconductor device 20 includes a semiconductor substrate 101, a first electrode 102, and a second electrode 104.

In this embodiment, the semiconductor substrate 101 has a laminated structure that includes an n+ type SiC semiconductor substrate 301 and an n type SiC epitaxial layer 302. A second main surface 106 of the semiconductor substrate 101 is formed by the SiC semiconductor substrate 301. A first main surface 105 of the semiconductor substrate 101 is formed by the SiC epitaxial layer 302. The second main surface 106 of the semiconductor substrate 101 may be a ground surface.

An n type impurity concentration of the SiC epitaxial layer 302 is not more than an n type impurity concentration of the SiC semiconductor substrate 301. The n type impurity concentration of the SiC epitaxial layer 302 may be not less than $1.0\times10^{15}$ cm$^{-3}$ and not more than $1.0\times10^{18}$ cm$^{-3}$. The SiC semiconductor substrate 301 is formed as a drain region of a MISFET. The SiC epitaxial layer 302 is formed as a drift region of the MISFET.

In this embodiment, the SiC epitaxial layer 302 has a plurality of regions that have different n type impurity concentrations along the normal direction of the first main surface 105 of the semiconductor substrate 101. More specifically, the SiC epitaxial layer 302 includes a high concentration region 302a that has a relatively high n type impurity concentration, and a low concentration region 302b that has a lower n type impurity concentration than the high concentration region 302a.

The high concentration region 302a is formed in a region on the first main surface 105 side. The low concentration region 302b is formed in a region of the semiconductor substrate 101 on the second main surface 106 side with respect to the high concentration region 302a. The n type impurity concentration of the high concentration region 302a may be not less than $1\times10^{16}$ cm$^{-3}$ and not more than $1\times10^{18}$ cm$^{-3}$. The n type impurity concentration of the low concentration region 302b may be not less than $1\times10^{15}$ cm$^{-3}$ and not more than $1\times10^{16}$ cm$^{-3}$.

The semiconductor device 20 includes the second electrode 104 serving as a drain electrode that is connected to the second main surface 106 of the semiconductor substrate 101. The second electrode 104 may include at least one layer among a Ti (titanium) layer, an Ni (nickel) layer, an Au (gold) layer, or an Ag (silver) layer. The second electrode 104 may have a four-layer structure that includes a Ti layer, an Ni layer, an Au layer, and an Ag layer that are laminated in that order from the second main surface 106 of the semiconductor substrate 101. The second electrode 104 may have a four-layer structure that includes a Ti layer, an Al (aluminum) Cu (alloy of Al and Cu) layer, an Ni layer, and an Au layer that are laminated in that order from the second main surface 106 of the semiconductor substrate 101.

The second electrode 104 may have a four-layer structure that includes a Ti layer, an AlSi (silicon) Cu (alloy of Al, Si, and Cu) layer, an Ni layer, and an Au layer that are laminated in that order from the second main surface 106 of the semiconductor substrate 101. The second electrode 104 may have a TiN (titanium nitride) layer in place of a Ti layer, or a laminated structure that includes a Ti layer and a TiN layer.

The semiconductor device 20 includes a p type body region 303 that is formed on a surface layer portion of the first main surface 105 of the semiconductor layer 101. A p type impurity concentration of the body region 303 may be not less than $1\times10^{17}$ cm$^{-3}$ and not more than $1\times10^{20}$ cm$^{-3}$.

The semiconductor device 20 includes a plurality of gate trenches 304 that are formed on the surface layer portion of the first main surface 105 of the semiconductor layer 101. The plurality of gate trenches 304 are formed in a striped shape in a plan view. Each of the gate trenches 304 passes through the body region 303 and reaches the SiC epitaxial layer 302.

The semiconductor device 20 includes a gate insulating layer 305 and a gate electrode layer 306 that are formed in each of the gate trenches 304. The gate insulating layer 305 includes silicon oxide. The gate insulating layer 305 may include other insulating films of silicon nitride, etc. The gate electrode layer 306 is embedded in the gate trench 304 across the gate insulating layer 305. The gate electrode layer 306 may include conductive polysilicon. The gate electrode layer 306 may include at least one kind of substance among tungsten, aluminum, copper, aluminum alloy, or copper alloy in place of conductive polysilicon.

The semiconductor device 20 includes a plurality of source trenches 307 that are formed on the first main surface 105 of the semiconductor substrate 101. Each of the source trenches 307 is formed in a region between the two adjacent gate trenches 304. The plurality of source trenches 307 are formed in a striped shape in a plan view. Each of the source trenches 307 passes through the body region 303 and reaches the SiC epitaxial layer 302.

The semiconductor device 20 includes a source insulating layer 308 and a source electrode layer 309 that are formed in each of the source trenches 307. The source insulating layer 308 may include silicon oxide. The source electrode layer 309 is embedded in the source trench 307 across the source insulating layer 308. The source electrode layer 309 may include the same kind of conductive material as the gate electrode layer 306. The source electrode layer 309 may include conductive polysilicon. The source electrode layer 309 may include at least one kind of substance among tungsten, aluminum, copper, aluminum alloy, or copper alloy in place of conductive polysilicon.

The semiconductor device 20 includes a plurality of n$^+$ type source regions 310 that are formed on the surface layer portion of the first main surface 105 of the semiconductor substrate 101. The plurality of source regions 310 are specifically formed in regions along the gate trenches 304 in a surface layer portion of the body region 303. The plurality of source regions 310 are formed in a striped shape in a plan view. Each of the source regions 310 is exposed from a side wall of the gate trench 304 and a side wall of the source trench 307.

The semiconductor device 20 includes a plurality of p$^+$ type contact regions 311 that are formed on the surface layer portion of the first main surface 105 of the semiconductor substrate 101. The plurality of contact regions 311 are formed along the side walls of each of the source trenches 307. A p type impurity concentration of the contact regions 311 is larger than the p type impurity concentration of the body region 303. The semiconductor device 20 includes a plurality of p type deep well regions 312 that are formed on the surface layer portion of the first main surface 105 of the semiconductor substrate 101. Each of the deep well regions 312 covers each of the source trenches 307 across each of the contact regions 311.

The semiconductor device 20 includes an interlayer insulating layer 313 that is formed on the first main surface 105 of the semiconductor substrate 101. The interlayer insulating layer 313 may include silicon oxide or silicon nitride. The interlayer insulating layer 313 may include PSG (Phosphor Silicate Glass) and/or BPSG (Boron Phosphor Silicate Glass) serving as an example of silicon oxide.

The semiconductor device 20 includes the first electrode 102 serving as a source electrode that is formed on the interlayer insulating layer 313. The first electrode 102 has a laminated structure that includes a first electrode layer 316, a second electrode layer 317, and a third electrode layer 318 that are laminated in that order from the first main surface 105 side of the semiconductor substrate 101. The first electrode layer 316 may have a single layer structure that includes a titanium layer or a titanium nitride layer. The first electrode layer 316 may have a laminated structure that includes a titanium layer and a titanium nitride layer that are laminated in that order from the first main surface 105 side of the semiconductor substrate 101.

The thickness of the second electrode layer 317 is larger than the thickness of the first electrode layer 316. The second electrode layer 317 includes a conductive material that has a lower resistance value than a resistance value of the first electrode layer 316. The second electrode layer 317 may include at least one substance among aluminum, copper, aluminum alloy, or copper alloy. The second electrode layer 317 may include at least one substance among aluminum-silicon alloy, aluminum-silicon-copper alloy, or aluminum-copper alloy. The second electrode layer 317 includes aluminum-silicon-copper alloy in this embodiment.

The third electrode layer 318 may have a single layer structure that includes a nickel layer or a copper layer. The third electrode layer 318 may have a laminated structure that includes a nickel layer and a copper layer.

Modified examples of this preferred embodiment will be described below. In the description above, an example in which the SiC semiconductor substrate is used as the semiconductor substrate 101 is shown. However, a semiconductor substrate that is constituted of other wide band gap semiconductors of GaN, etc., may be adopted as the semiconductor substrate 101. The wide band gap semiconductor is a semiconductor that has a band gap exceeding a band gap of silicon. As a matter of course, the semiconductor substrate

101 may be constituted of an Si semiconductor substrate. In a case where the semiconductor substrate 101 that is constituted of an Si semiconductor substrate is adopted, an IGBT may be formed in the semiconductor substrate 101.

Figure 16:
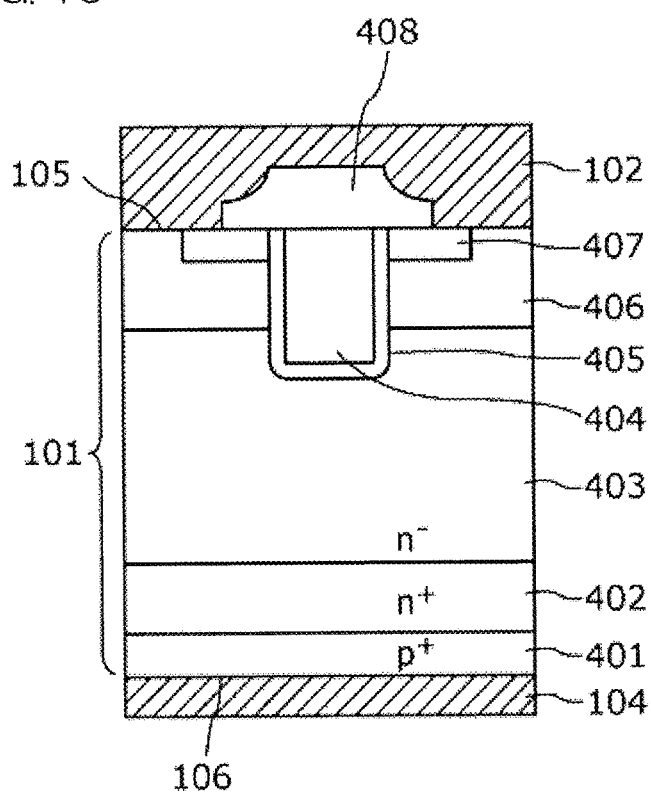
FIG. 16 is a sectional view of an IGBT according to the preferred embodiment.

FIG. 16 is a sectional view of a semiconductor device 20 that includes an IGBT. In the IGBT, an element structure is formed on the first main surface 105 side of an n⁻ type silicon substrate 403 (semiconductor substrate 101), and a rear surface structure is formed on the second main surface 106 side. In a surface layer portion of the rear surface (second main surface), an n type buffer layer 402 and a p⁺ type collector layer 401 are formed. The buffer layer 402 has an n type impurity concentration higher than an impurity concentration of the silicon substrate 403, and is formed on the surface layer portion of the rear surface (second main surface).

The collector layer 401 is formed in a region on the rear surface (second main surface) side with respect to the buffer layer 402 in the surface layer portion of the rear surface (second main surface). The IGBT includes a trench gate 404, a gate oxide film 405, a p type channel layer 406, an n type emitter layer 407, an intermediate film 408, a first electrode 102 serving as a surface metal electrode, and a second electrode 104 serving as a rear surface metal electrode.

Figure 17:
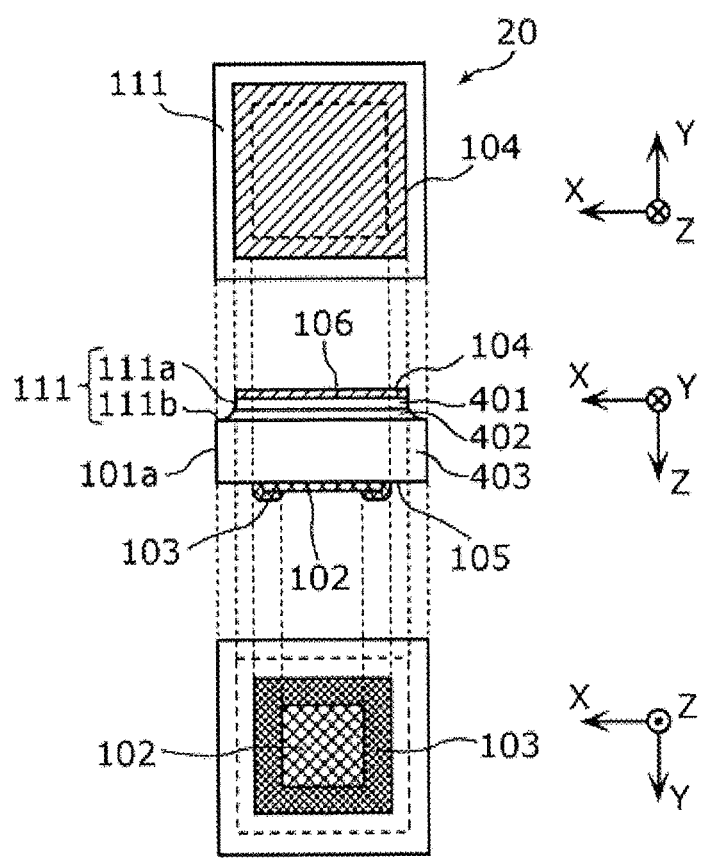
FIG. 17 is a diagram showing plan and sectional structures of a semiconductor device including the IGBT according to the preferred embodiment.

FIG. 17 is a diagram showing an arrangement of the semiconductor device 20 that includes the IGBT. In this preferred embodiment, a notched portion 111 is formed as in the preferred embodiment described above. The collector layer 401 has a thickness of not less than 0.3 µm and not more than 1.5 µm. The notched portion 111 is formed to a position that is deeper than an interface portion between the collector layer 401 and the buffer layer 402.

The notched portion 111 may be formed to be deeper than an interface portion between the buffer layer 402 and the silicon substrate 403 such as to reach a drift region (silicon substrate 403). The notched portion 111 may be formed to a depth position that is an intermediate portion of the buffer layer 402 so as not to reach the interface portion between the buffer layer 402 and the silicon substrate 403. Other elements of the method for manufacturing and the structure are the same as the case of the SiC substrate described above.

In the description above, an example in which the two dicing steps that include the partial cutting step and the full cutting step are performed is described. However, by removing part of the second electrode 104 from the second main surface 106 side by a method other than the dicing steps in place of the partial cutting step, the removed region 109 may be formed. For example, part of the second electrode 104 may be removed by an etching method or a lift-off method. In the case of the lift-off method, a second electrode 104 in which dicing lines are exposed is formed. Therefore, in this case, a step of forming the second electrode 104 includes a step of removing the second electrode 104 (that is, part or all of the step of forming the removed region 109).

Although the methods for manufacturing the semiconductor devices and the semiconductor devices according to one or a plurality of modes have been described based on the preferred embodiments, the present invention is not limited to these preferred embodiments. As long as the spirit and scope of the present invention is not departed from, embodiments in which various modifications that those skilled in the art can arrive at are applied to these preferred embodiments and embodiments constructed by a combination of the constituent elements in different preferred embodiments are also included within the scope of the present invention.

Various modifications, replacements, additions, omissions, etc., can be performed within the scope of the claims or the scope of equivalents thereof on the respective preferred embodiments described above. For example, although, with each of the preferred embodiments described above, the numerical values of the shape and the depth of the groove and the notched portion, etc., were described mainly based on the example of the method for manufacturing the semiconductor device in which the SiC substrate is used, the present invention is similarly applied to a description of a semiconductor device in which a silicon substrate is used such as an IGBT.

Feature examples that are extracted from the preferred embodiments described above and the attached drawings are indicated below. The feature examples to be shown below are just examples and not meant to limit features that are extracted from the preferred embodiments and the attached drawings.

[A1] A method for manufacturing a semiconductor device including a step of forming, on a first main surface of a semiconductor substrate that has the first main surface and a second main surface on the opposite side of the first main surface, a first electrode in each of a plurality of semiconductor device forming regions, and forming a protective film such that a periphery of the first electrode is surrounded in a plan view, a step of forming a second electrode over the entire surface of the second main surface of the semiconductor substrate, a step of holding the first main surface side of the semiconductor substrate after the first electrode, the protective film, and the second electrode are formed by a holding member, a step of forming a removed region by removing part of the second electrode along dicing streets from the second main surface side such that part of the semiconductor substrate remains in a state where the semiconductor substrate is held by the holding member, and a step of dicing the semiconductor substrate into a plurality of semiconductor devices by cutting the semiconductor substrate by blade dicing in the removed region.

[A2] The method for manufacturing the semiconductor device according to A1 in which the semiconductor substrate is an SiC substrate.

[A3] The method for manufacturing the semiconductor device according to A2 in which the first main surface is constituted of a silicon plane (0001) surface of an SiC monocrystal, and the second main surface is constituted of a carbon plane (000-1) surface of an SiC monocrystal.

[A4] The method for manufacturing the semiconductor device according to any one of A1 to A3 in which the step of forming the removed region includes a step of forming the removed region by removing the second electrode along the dicing streets by blade dicing.

[A5] The method for manufacturing the semiconductor device according to any one of A1 to A4 in which the step of removing the second electrode does not use an ultrasonic blade.

[A6] The method for manufacturing the semiconductor device according to any one of A1 to A5 in which the step of dicing does not use an ultrasonic blade.

[A7] The method for manufacturing the semiconductor device according to any one of A1 to A6 in which layer thickness of the second electrode is not less than 500 nm.

[A8] The method for manufacturing the semiconductor device according to any one of A1 to A7 in which the second electrode has a laminated structure that includes a Ti layer, an Ni layer, and an Au layer that are laminated in that order from the semiconductor substrate (SiC substrate) side.

[A9] The method for manufacturing the semiconductor device according to any one of A1 to A7 in which the second electrode has a laminated structure that includes an NiSi layer, a Ti layer, and an Ni layer that are laminated in that order from the semiconductor substrate (SiC substrate) side.

[A10] The method for manufacturing the semiconductor device according to any one of A1 to A7 in which the second electrode has a laminated structure that includes an Ni layer, a Ti layer, and an Ni layer that are laminated in that order from the semiconductor substrate (SiC substrate) side.

[A11] The method for manufacturing the semiconductor device according to any one of A1 to A7 in which the second electrode has a laminated structure that includes an Ni layer, a Ti layer, and an NiV layer that are laminated in that order from the semiconductor substrate (SiC substrate) side.

[A12] The method for manufacturing the semiconductor device according to any one of A8 to A11 in which the second electrode is arranged such that the total layer thickness of Ni or nickel alloy is not less than 500 nm in the laminated structure.

[A13] The method for manufacturing the semiconductor device according to any one of A8 to A11 in which the second electrode is arranged such that only an Ni layer is not less than 500 nm in the laminated structure.

[B1] A semiconductor device including a semiconductor substrate that has a first main surface and a second main surface on the opposite side of the first main surface, a first electrode that is provided on the first main surface of the semiconductor substrate, a protective film that is formed to surround a periphery of the first electrode, and a second electrode that is provided on the second main surface of the semiconductor substrate in which an outer peripheral end of the second electrode is separated from each of a plurality of side surfaces of the semiconductor substrate in a plan view.

[B2] The semiconductor device according to B1 in which thickness of the second electrode is not less than 500 nm and not more than 1,500 nm.

[B3] The semiconductor device according to B1 or B2 in which a notched portion is formed in the semiconductor substrate in an outer peripheral region from the plurality of side surfaces of the semiconductor substrate to the outer peripheral end of the second electrode.

[B4] The semiconductor device according to B3 in which the notched portion forms a step portion that has a side surface portion and a bottom surface portion.

[B5] The semiconductor device according to B3 or B4 in which the notched portion forms an oblique plane that connects the second main surface and the side surfaces.

[B6] The semiconductor device according to any one of B3 to B5 in which the notched portion has a depth that is not more than 70% of the thickness of the semiconductor substrate.

[B7] The semiconductor device according to any one of B3 to B6 in which the semiconductor substrate includes an epitaxial layer, and the notched portion has a depth that does not reach the epitaxial layer.

[B8] The semiconductor device according to any one of B3 to B7 in which the depth of the notched portion is not less than 5 μm.

[B9] The semiconductor device according to any one of B3 to B8 in which a distance from a surface of the second electrode to a bottom portion of the notched portion is not less than 10 μm.

[B10] The semiconductor device according to any one of B3 to B9 in which the width of the notched portion is smaller than the depth of the notched portion.

[B11] The semiconductor device according to any one of B3 to B10 in which an end surface of the second electrode and the notched portion of the semiconductor substrate are continuously formed.

[C1] An installment structure including the semiconductor device according to any one of B3 to B11, a conductive base material, a sealing member that seals the semiconductor device and the base material, and a conductive bonding layer that bonds the base material and the second electrode of the semiconductor device in which the sealing member is filled into the notched portion.

[C2] The installment structure according to C1 in which the sealing member is constituted of a resin that includes a filler.

[C3] The installment structure according to C1 or C2 in which the width and depth of the notched portion are larger than an average grain diameter of the filler.

[C4] The installment structure according to any one of C1 to C3 in which the bonding layer is a solder or a silver sintered metal layer.

[C5] The installment structure according to any one of C1 to C4 in which a space is formed between the bonding layer and the notched portion, and the resin is filled into the space.

[D1] A power semiconductor device including the semiconductor device according to any one of B3 to B11, a conductive first base material, a conductive second base material that is electrically separated from the first base material, a conductive bonding layer that bonds the first base material and the second electrode of the semiconductor device, a conductive member that electrically connects the second base material and the first electrode of the semiconductor device, and a sealing member that seals the semiconductor device, the first base material, the second base material, the bonding layer, and the conductive member in which the sealing member is filled into the notched portion.

[D2] The power semiconductor device according to D1 in which the sealing member is constituted of a resin that includes a filler.

[D3] The power semiconductor device according to D1 or D2 in which the width and depth of the notched portion are larger than an average grain diameter of the filler.

[D4] The power semiconductor device according to any one of D1 to D3 in which the bonding layer is a solder or a silver sintered metal layer.

[D5] The power semiconductor device according to any one of D1 to D4 in which a space is formed between the bonding layer and the notched portion, and the resin is filled into the space.

[D6] The power semiconductor device according to any one of D1 to D5 in which the conductive member is a bonding wire.

[D7] The power semiconductor device according to any one of D1 to D5 in which the conductive member is a solder or a silver sintered metal layer.

[D8] The power semiconductor device according to any one of D1 to D7 in which any one of or both the first base material and the second base material is constituted of a copper frame.

Although alphanumeric characters within the parentheses in the following [E1] to [E20] express corresponding constituent elements, etc., in the preferred embodiments described above, these are not meant to limit the scope of the respective items to the preferred embodiments.

[E1] A method for manufacturing a semiconductor device (20), including a step of preparing a semiconductor substrate (101) that has a first main surface (105) on one side and a second main surface (106) on the other side, the semiconductor substrate on which a plurality of device forming regions (100) and an intended cutting line (121) that demarcates the plurality of device forming regions (100) are set, a step of forming a first electrode (102) that covers the first main surface (105) in each of the device forming regions (100), a step of forming a second electrode (104) that covers the second main surface (106), a step of partially removing the second electrode (104) along the intended cutting line (121) such that the semiconductor substrate (101) is exposed, and forming a removed portion (109) that extends along the intended cutting line (121), and a step of cutting the semiconductor substrate (101) along the removed portion (109).

[E2] The method for manufacturing the semiconductor device (20) according to E1, further including a step of, before the step of forming the removed portion (109), forming a protective film (103) that covers a periphery of the first electrode (102) on the first main surface (105) in each of the device forming regions (100).

[E3] The method for manufacturing the semiconductor device (20) according to E2 in which the step of forming the protective film (103) includes a step of forming the protective film (103) that exposes the intended cutting line (121), the step of forming the removed portion (109) includes a step of forming the removed portion (109) at a position that does not overlap the protective film (103) in a plan view, and the step of cutting includes a step of cutting the semiconductor substrate (101) along the removed portion (109) that is positioned outside of the protective film (103).

[E4] The method for manufacturing the semiconductor device (20) according to any one of E1 to E3 in which the step of forming the removed portion (109) includes a step of forming the removed portion (109) that passes through the second electrode (104) and reaches a thickness direction intermediate portion of the semiconductor substrate (101).

[E5] The method for manufacturing the semiconductor device (20) according to E4 in which the step of cutting includes a step of cutting the semiconductor substrate (101) along the removed portion (109) such that part of the removed portion (109) remains as a notched portion (111).

[E6] The method for manufacturing the semiconductor device (20) according to any one of E1 to E5 in which the step of forming the removed portion (109) includes a step of forming the removed portion (109) by a dicing blade (108).

[E7] The method for manufacturing the semiconductor device (20) according to any one of E1 to E6 in which the step of cutting includes a step of cutting the semiconductor substrate (101) by a dicing blade (110).

[E8] The method for manufacturing the semiconductor device (20) according to E7 in which the step of cutting includes a step of cutting the semiconductor substrate (101) through the removed portion (109) by the dicing blade (108) that has a thickness of less than the width of the removed portion (109).

[E9] The method for manufacturing the semiconductor device (20) according to any one of E1 to E8, further including a step of, before the step of forming the removed portion (109), supporting the semiconductor substrate (101) by a supporting member (107) from the first main surface (105) side in which the step of forming the removed portion (109) includes a step of forming the removed portion (109) in a state where the semiconductor substrate (101) is supported by the supporting member (107).

[E10] The method for manufacturing the semiconductor device (20) according to any one of E1 to E9 in which the semiconductor substrate (101) includes SiC.

[E11] A semiconductor device (20) including a semiconductor substrate (101) that has a first main surface (105) on one side and a second main surface (106) on the other side, a first electrode (102) that covers the first main surface (105), and a second electrode (104) that is separated from a peripheral edge of the second main surface (106) such that a peripheral edge portion of the second main surface (106) is exposed, and covers the second main surface (106).

[E12] The semiconductor device (20) according to E11, further including the first electrode (102) that is separated from a peripheral edge of the first main surface (105) and covers the first main surface (105), and a protective film (103) that covers a peripheral edge portion of the first main surface (105).

[E13] The semiconductor device (20) according to E12 in which the protective film (103) is separated from the peripheral edge of the first main surface (105) and covers the peripheral edge portion of the first main surface (105) in a plan view.

[E14] The semiconductor device (20) according to any one of E11 to E13, further including a notched portion (111) that is recessed toward the peripheral edge portion of the first main surface (105) in the peripheral edge portion of the second main surface (106).

[E15] The semiconductor device (20) according to E14 in which the notched portion (111) continues to a peripheral edge of the second electrode (104).

[E16] The semiconductor device (20) according to E14 or E15 in which the notched portion (111) is formed over the entire circumference of the peripheral edge portion of the second main surface (106) such as to surround the second electrode (104) in a plan view.

[E17] The semiconductor device (20) according to any one of E14 to E16 in which the notched portion (111) has a first wall portion that extends in the thickness direction of the semiconductor substrate (101), and a second wall portion that extends from the first wall portion in the direction along the first main surface (105) such as to overlap the peripheral edge portion of the first main surface (105) in a plan view.

[E18] The semiconductor device (20) according to any one of E11 to E17 in which the peripheral edge of the first main surface (105) is angular.

[E19] The semiconductor device (20) according to any one of E11 to E18 in which the semiconductor substrate (101) includes SiC.

[E20] A sealing structure including a conductive base material (113), the semiconductor device (20) according to any one of E11 to E19, the semiconductor device being arranged on the base material (113) in an orientation that the second electrode (104) opposes the base material (113), a conductive bonding material (112) that is interposed between the second electrode (104) and the base material (113), and a sealing material (114) that seals the base material (113), the semiconductor device (20), and the bonding material (112) such as to cover a portion of the second main surface (106) that is exposed from the second electrode (104).

In regard to industrial applicability, the present invention can be applied to methods for manufacturing semiconductor devices and semiconductor devices, etc. While the preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST 10 semiconductor wafer
20 semiconductor device
100 semiconductor device forming region 101 semiconductor substrate
102 first electrode
102a first electrode
102b first electrode
103 protective film
104 second electrode
105 first main surface
106 second main surface
107 holding member (supporting member)
108 first blade (blade)
110 second blade (blade)
109 removed region (removed portion)
111 notched portion
112 bonding layer
113 base material
114 resin
121 dicing street

The invention claimed is:

1. A method for manufacturing a semiconductor device, comprising:
a step of preparing a semiconductor substrate that has a first main surface on one side and a second main surface on the other side, the semiconductor substrate on which device forming regions and an intended cutting line that demarcates the device forming regions are set;
a step of forming a first electrode that covers the first main surface in each of the device forming regions;
a step of forming a second electrode that covers the second main surface;
a step of forming a removed portion of a groove shape by partially removing the semiconductor substrate and the second electrode in a thickness direction of the semiconductor substrate along the intended cutting line; and
a step of cutting the semiconductor substrate along the removed portion;
wherein the semiconductor substrate has a substrate and an epitaxial layer that are laminated in that order from the second main surface side to the first main surface side, and
the removed portion is formed in the substrate at an interval from the epitaxial layer to the second main surface side, in regard to the thickness direction.

2. The method for manufacturing the semiconductor device according to claim 1, further comprising:
a step of forming a protective film that covers a periphery of the first electrode on the first main surface in each of the device forming regions before the step of forming the removed portion.

3. The method for manufacturing the semiconductor device according to claim 2,
wherein the step of forming the protective film includes a step of forming the protective film that exposes the intended cutting line,
the step of forming the removed portion includes a step of forming the removed portion at a position that does not overlap the protective film in plan view, and
the step of cutting includes a step of cutting the semiconductor substrate along the removed portion that is positioned outside of the protective film.

4. The method for manufacturing the semiconductor device according to claim 1,
wherein the step of forming the removed portion includes a step of forming the removed portion that passes through the second electrode and reaches an intermediate portion of the semiconductor substrate, in regard to the thickness direction.

5. The method for manufacturing the semiconductor device according to claim 4,
wherein the step of cutting includes a step of cutting the semiconductor substrate along the removed portion such that part of the removed portion remains as a notched portion.

6. The method for manufacturing the semiconductor device according to claim 1,
wherein the step of forming the removed portion includes a step of forming the removed portion by a dicing blade.

7. The method for manufacturing the semiconductor device according to claim 1,
wherein the step of cutting includes a step of cutting the semiconductor substrate by a dicing blade.

8. The method for manufacturing the semiconductor device according to claim 7,
wherein the step of cutting includes a step of cutting the semiconductor substrate through the removed portion by the dicing blade that has a thickness of less than the width of the removed portion.

9. The method for manufacturing the semiconductor device according to claim 1, further comprising:
a step of supporting the semiconductor substrate by a supporting member from the first main surface side, before the step of forming the removed portion;
wherein the step of forming the removed portion includes a step of forming the removed portion in a state where the semiconductor substrate is supported by the supporting member.

10. The method for manufacturing the semiconductor device according to claim 1,
wherein the semiconductor substrate includes SiC.

11. A semiconductor device comprising:
a semiconductor substrate that has a first main surface on one side and a second main surface on the other side;
a first electrode that covers the first main surface;
a notched portion that is formed in a peripheral edge portion of the second main surface and recessed toward the first main surface, in regard to a thickness direction of the semiconductor substrate; and
a second electrode that covers the second main surface;
wherein the semiconductor substrate has a substrate and an epitaxial layer that are laminated in that order from the second main surface side to the first main surface side, and
the notched portion is formed in the substrate at an interval from the epitaxial layer to the second main surface side, in regard to the thickness direction.

12. The semiconductor device according to claim 11, further comprising:
the first electrode that is separated from a peripheral edge of the first main surface and covers the first main surface; and
a protective film that covers a peripheral edge portion of the first main surface.

13. The semiconductor device according to claim 12,
wherein the protective film is separated from the peripheral edge of the first main surface and covers the peripheral edge portion of the first main surface in plan view.

14. The semiconductor device according to claim 11,
wherein the notched portion continues to a peripheral edge of the second electrode.

15. The semiconductor device according to claim 11,
wherein the notched portion is formed over the entire circumference of the peripheral edge portion of the second main surface such as to surround the second electrode in plan view.

16. The semiconductor device according to claim 11,
wherein the notched portion has a first wall portion that extends in the thickness direction of the semiconductor substrate, and a second wall portion that extends from the first wall portion in the direction along the first main surface such as to overlap the peripheral edge portion of the first main surface in plan view.

17. The semiconductor device according to claim 11, wherein a peripheral edge of the first main surface is angular.

18. The semiconductor device according to claim 11, wherein the semiconductor substrate includes SiC.

19. A sealing structure comprising:
a conductive base material;
the semiconductor device according to claim 11, the semiconductor device being arranged on the base material in an orientation that the second electrode opposes the base material;
a conductive bonding material that is interposed between the second electrode and the base material; and
a sealing material that seals the base material, the semiconductor device, and the bonding material such as to cover a portion of the second main surface that is exposed from the second electrode.

20. The semiconductor device according to claim 11, wherein the second electrode covers the second main surface outside the notched portion.

* * * * *